(12) United States Patent
Matsudai

(10) Patent No.: US 10,490,655 B2
(45) Date of Patent: Nov. 26, 2019

(54) INSULATED GATE BIPOLAR TRANSISTOR (IGBT) WITH HIGH AVALANCHE WITHSTAND

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Tomoko Matsudai, Shibuya Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 15/910,384

(22) Filed: Mar. 2, 2018

(65) Prior Publication Data

US 2019/0006494 A1 Jan. 3, 2019

(30) Foreign Application Priority Data

Jun. 29, 2017 (JP) .................. 2017-127267

(51) Int. Cl.
| | | |
|---|---|---|
| *H01L 29/739* | (2006.01) | |
| *H01L 29/417* | (2006.01) | |
| *H01L 29/423* | (2006.01) | |
| *H01L 29/10* | (2006.01) | |
| *H01L 29/08* | (2006.01) | |
| *H01L 29/06* | (2006.01) | |
| *H01L 29/36* | (2006.01) | |
| *H01L 29/40* | (2006.01) | |

(52) U.S. Cl.
CPC ...... *H01L 29/7395* (2013.01); *H01L 29/0696* (2013.01); *H01L 29/0804* (2013.01);
(Continued)

(58) Field of Classification Search
CPC ............. H01L 29/7395; H01L 29/0804; H01L 29/7397; H01L 29/36; H01L 29/0696;
(Continued)

(56) References Cited

U.S. PATENT DOCUMENTS

| 7,777,249 B2 | 8/2010 | Hamaguchi et al. |
| 7,868,397 B2 | 1/2011 | Tsukuda et al. |

(Continued)

FOREIGN PATENT DOCUMENTS

| JP | 2008181975 A | 8/2008 |
| JP | 2009099713 A | 5/2009 |

(Continued)

OTHER PUBLICATIONS

Tomoko Matsudai et al., 1200V SC (Schottky Controlled Injection)—Diode, An Advanced Fast Recovery Concept with High Carrier Lifetime, Proceedings of the 25th International Symposium on Power Semiconductor Devices & ICs, Kanazawa, 2013, pp. 339-342.

(Continued)

*Primary Examiner* — Selim U Ahmed
(74) *Attorney, Agent, or Firm* — Kim & Stewart LLP

(57) ABSTRACT

A semiconductor device includes a semiconductor layer between a collector electrode and an emitter electrode. The semiconductor layer includes a base region of a first conductivity type, a first collector layer of a second conductivity type between the collector electrode in a cell region in which an emitter layer is arranged and the base layer, and a second collector layer of the second conductivity type between the collector electrode in a boundary region in which a gate wiring is arranged and the base layer. A peak value of an impurity concentration of the second conductivity type in the second collector layer is higher than a peak value of an impurity concentration of the second conductivity type in the first collector layer.

14 Claims, 6 Drawing Sheets

(52) U.S. Cl.
CPC ...... *H01L 29/0821* (2013.01); *H01L 29/0834* (2013.01); *H01L 29/1004* (2013.01); *H01L 29/1095* (2013.01); *H01L 29/36* (2013.01); *H01L 29/41708* (2013.01); *H01L 29/4238* (2013.01); *H01L 29/42372* (2013.01); *H01L 29/7397* (2013.01); *H01L 29/405* (2013.01)

(58) Field of Classification Search
CPC ........... H01L 29/1004; H01L 29/42372; H01L 29/41708; H01L 29/0821; H01L 29/1095
See application file for complete search history.

(56) References Cited

U.S. PATENT DOCUMENTS

| | | | |
|---|---|---|---|
| 9,054,152 | B2 | 6/2015 | Ogura et al. |
| 9,219,060 | B2 | 12/2015 | Ogura |
| 2018/0315819 | A1* | 11/2018 | Tanaka .................... H01L 29/78 |

FOREIGN PATENT DOCUMENTS

| | | |
|---|---|---|
| JP | 2012064717 A | 3/2012 |
| JP | 2015023141 A | 2/2015 |
| JP | 6158123 B2 | 7/2017 |

OTHER PUBLICATIONS

Ze Chen et al., LPT(II)-CSTBT (III) for High Voltage Application with Ultra Robust Turn-off Capability Utilizing Novel Edge Termination Design, Proceedings of the 2012 24th International Symposium on Power Semiconductor Devices and ICs Jun. 3-7, 2012—Bruges, Belgium, 2012, pp. 25-28.

\* cited by examiner (a)

(b)

INSULATED GATE BIPOLAR TRANSISTOR (IGBT) WITH HIGH AVALANCHE WITHSTAND

CROSS REFERENCE TO RELATED APPLICATION

This application claims the benefit of, and priority to, Japanese Patent Application No. 2017-127267 filed on Jun. 29, 2017, the entire contents of which are incorporated herein by reference.

FIELD

Embodiments described herein relate generally to a semiconductor device.

BACKGROUND

A semiconductor device which inverts electric power by switching, amplifying, or rectifying is called a power semiconductor device. Power semiconductor devices primarily include bipolar transistors, thyristors, MOSFETs (Metal Oxide Silicon Field Effect Transistors), or IGBTs (Insulated-Gate Bipolar Transistors) as a switching element, or a pn junction diode, a pin diode (p-intrinsic-n Diode), or SBD (Shottky Barrier Diode) as a rectifying element.

IGBTs as a bipolar element can be operated at high speed due to their having a MOS gate, be driven with a large current with low loss, and have a large safety operation region with a high breakdown voltage and are used in various fields and have been actively developed. IGBTs, which are operated with the low loss, the large drive current, and the high breakdown voltage, can be widely applied while being operated at lower speeds than an operation speed of a MOSFET as a unipolar element. In such IGBT, an avalanche withstand value at which an element does not break down in an avalanche phenomenon during switching operation is considered as an important design item.

A semiconductor device with a high avalanche withstand amount is provided in the present embodiments.

SUMMARY

In some embodiments according to one aspect, a semiconductor device includes a semiconductor layer with a first main surface and a second main surface, a collector electrode provided on the first main surface, an emitter electrode provided on the second main surface, a gate electrode provided in the second main surface side of the semiconductor layer and extending in a first direction, a gate wiring provided on the second main surface and extending in a second direction intersecting with the first direction and connected to the gate electrode, and an insulating film provided between the gate electrode and the semiconductor layer. The semiconductor layer includes a base layer of a first conductivity type, a base layer of a second conductivity type provided between the base layer of the first conductivity type and the emitter electrode, a first conductivity type emitter layer provided between the base layer of the second conductivity type and the emitter electrode and connected to the emitter electrode, a first collector layer of the second conductivity type provided between the collector electrode in a cell region in which the emitter layer is arranged and the base layer of the first conductivity type, and the second collector layer of the second conductivity type provided between the collector electrode in a boundary region in which the gate wiring is arranged and the base layer of the first conductivity type, the second collector layer having a peak value of an impurity concentration of the second conductivity type of the second collector layer higher than a peak value of impurity concentration of the second conductivity type of the first collector layer.

DETAILED DESCRIPTION

In this disclosure, corresponding or substantially similar elements or aspects are given a same reference signs, and duplicate description thereof may not be omitted as appropriate.

In some embodiments, a first conductivity type and a second conductivity type may be respectively referred to as an n type, and a p type, or the first conductivity type and the second conductivity type may be respectively referred to as the p type and the n type.

Semiconductor materials that may be used for the present embodiments, including not only silicon, but silicon carbide, gallium nitride, or gallium oxide.

The impurity concentration and the number of the impurities can be respectively assumed to be the carrier concentration and the relative number of the carriers in a layer of the device.

Figure 1:
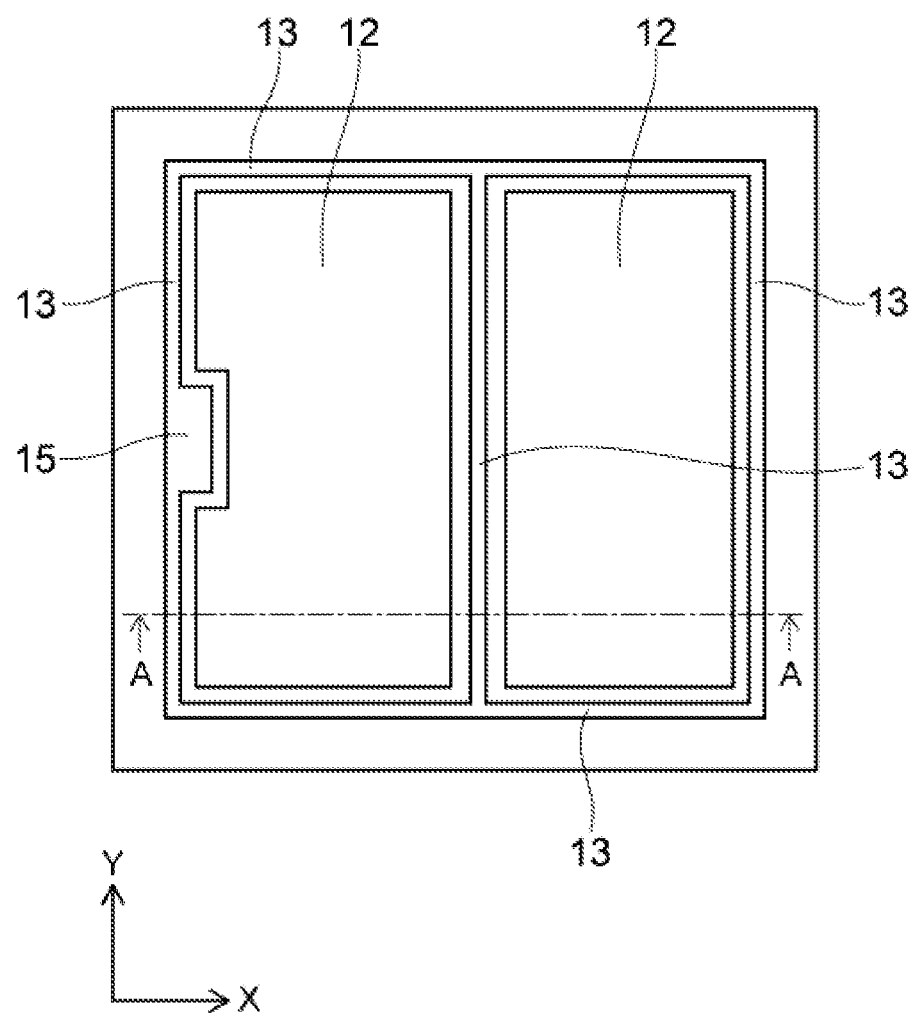
FIG. 1 is a schematic upper surface view of a semiconductor device according to an embodiment.
Figure 2:
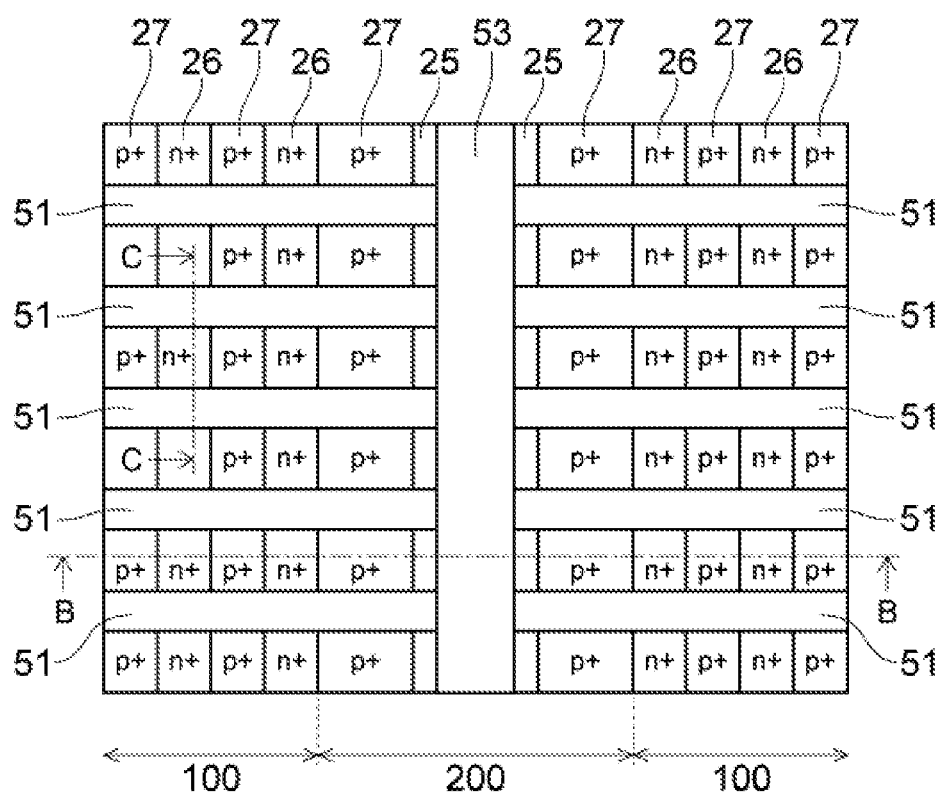
FIG. 2 is a schematic plane view of the semiconductor device according to the embodiment.
Figure 3:
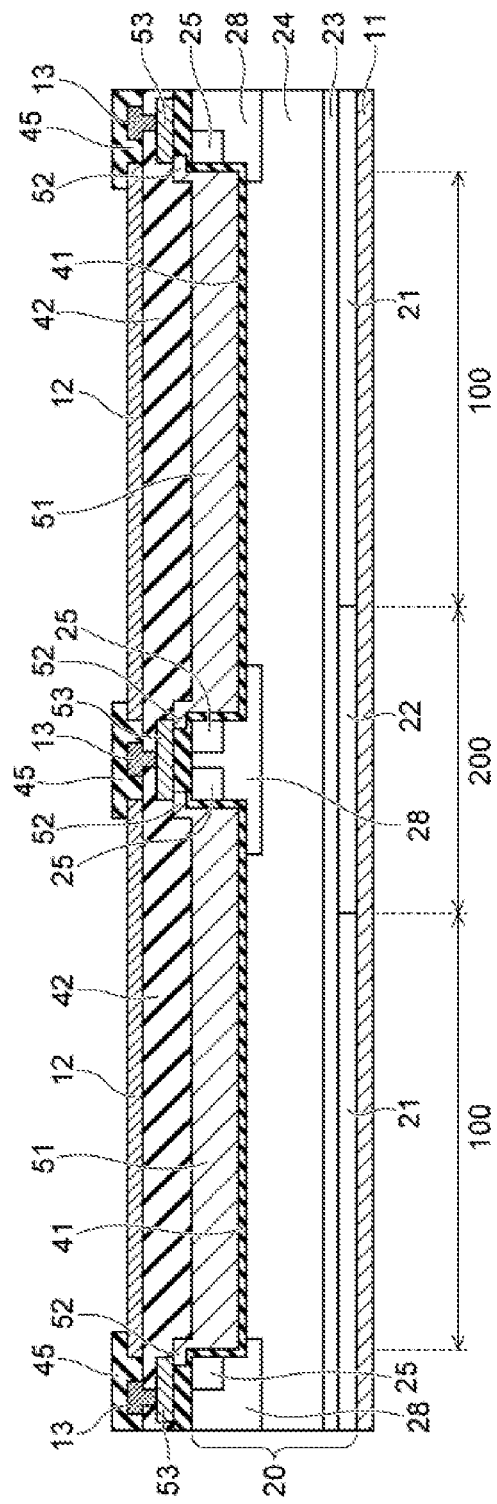
FIG. 3 is a cross-sectional view of the semiconductor device taken along A-A line in FIG. 1.
Figure 4A:
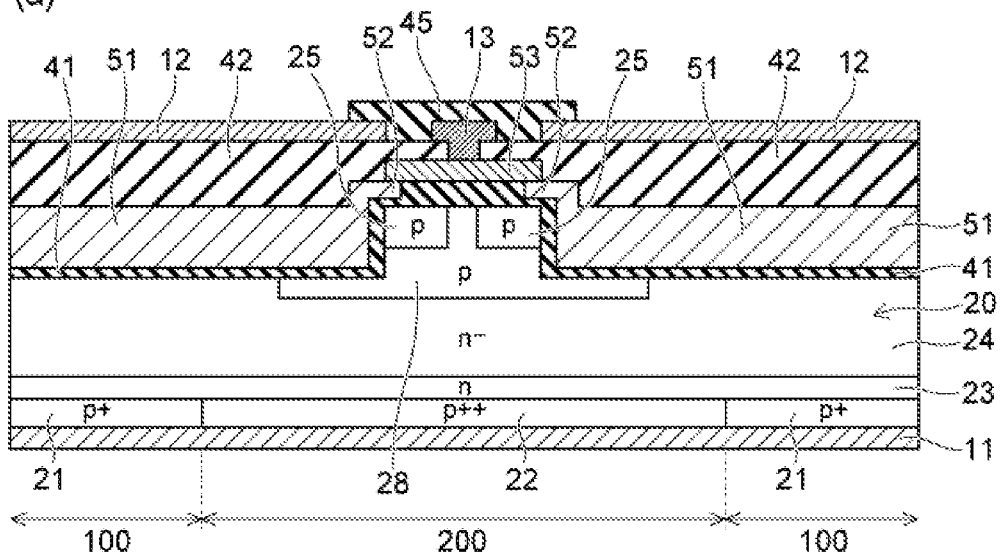
FIG. 4A is an enlarged view of a part of the semiconductor device shown in FIG. 3.
Figure 4B:
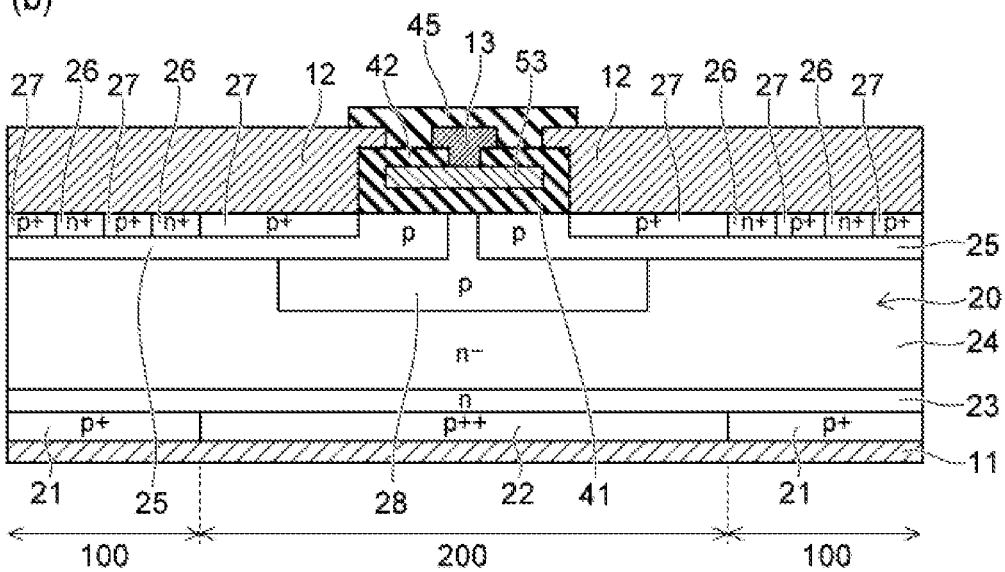
FIG. 4B is a cross-sectional view of the semiconductor device taken along B-B line in FIG. 2.
Figure 5:
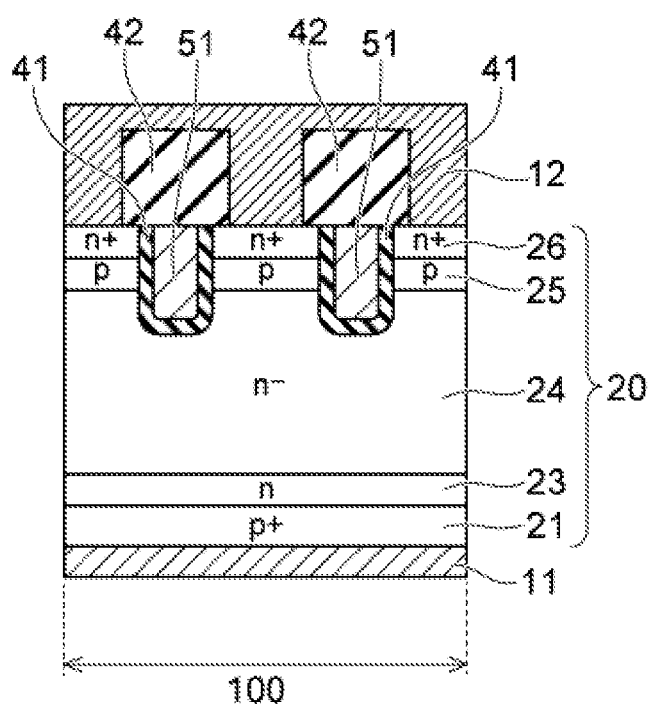
FIG. 5 is a cross-sectional view of the semiconductor device taken along C-C line in FIG. 2.

FIG. 1 is a schematic upper surface view of a semiconductor device according to the embodiment. FIG. 2 is a schematic plane view of the semiconductor device representing an example of a layout of a gate electrode 51 and each layer in a semiconductor device according to the embodiment. FIG. 3 is a cross-sectional view of the semiconductor device taken along line A-A in FIG. 1. FIG. 4A is an enlarged view of a part of the semiconductor device of FIG. 3 and FIG. 4B is a cross-sectional view of the semiconductor device taken along line B-B in FIG. 2. FIG. 5 is a cross-sectional view of the semiconductor device taken along line C-C in FIG. 2.

The semiconductor device according to the present embodiment includes a collector electrode 11, an emitter electrode 12, and a semiconductor layer 20 between the collector electrode 11 and the emitter electrode 12 to provide a vertical type IGBT in which a current is applied in a direction connecting the collector electrode 11 and the emitter electrode 12 (e. g., a vertical direction) as shown in FIG. 3 through FIG. 5.

The semiconductor layer 20 includes a first main surface (depicted as a lower surface in FIG. 3 through FIG. 5) and a second main surface (depicted as an upper surface in FIG. 3 through FIG. 5). The collector electrode 11 is provided on the first main surface and the emitter electrode 12 is provided on the second main surface.

Two directions intersecting with each other on a plane which is parallel to the first main surface or the second main surface are respectively referred to as a X direction and a Y direction in FIG. 1 and FIG. 2.

The semiconductor device includes a plurality of cell regions 100, in FIG. 2 two cell regions 100, and a boundary region 200 (or referred to as a gate wiring region) arranged in a boundary between the plurality of cell regions 100. An end terminal region not shown in the figures is formed to surround the cell regions 100 outside of the cell regions.

A configuration of the cell region 100 will be described by referring to FIG. 5.

Referring to FIGS. 4A and 4B, the semiconductor layer 20 here includes a silicon layer doped with the impurities. The semiconductor layer 20 in the cell region 100 includes a $p^+$ type first collector layer 21, an n type buffer layer 23, an $n^-$ type base layer 24 (or referred to as a drift layer), a P type base layer 25, and an $n^+$ type emitter layer 26 and a $p^+$ type base contact layer 27 (also shown in FIG. 2).

The n type impurity concentrations of the buffer layer 23 and the emitter layer 26 are higher than the n type impurity concentration of the $n^-$ type base layer 24. The impurity concentration represents a peak value, for example.

The first collector layer 21 is provided on and connected to the collector electrode 11. The buffer layer 23 is provided on the first collector layer 21. The $n^-$ type base layer 24 is provided on the buffer layer 23. The p type base layer 25 is provided on the $n^-$ type base layer 24. The emitter layer 26 is provided on the p type base layer 25.

As shown in FIG. 2, the plurality of emitter layers 26 are spaced apart from each other in the X direction and selectively formed on the surface of the p type base layer 25.

The semiconductor device may include a gate electrode 51 with a trench gate structure. The gate electrode 51 extends inwardly of the second surface side of the semiconductor layer 20 as shown in FIG. 5. An insulating film 41 is provided between a side surface of the gate electrode 51 and the semiconductor layer 20 and between a bottom portion side of the gate electrode and the semiconductor layer 20. The insulating film 41 may be a silicon oxide film, for example.

The insulating film 41 may be formed on an inner wall of a trench which extends inwardly of the second main surface side of the semiconductor layer 20 using a thermal oxidization method, for example, and polycrystalline silicon is deposited over the insulating film 41 to form the gate electrode 51.

As shown in FIG. 2, the plurality of the gate electrodes 51 extend in the X direction and are separated, or spaced, from one another in the Y direction. As shown in FIG. 5, the gate electrodes 51 extend into the $n^-$ type base layer 24, and pass though the emitter layer 26 and the p type base layer 25. The side surface of the gate electrodes 51 faces the emitter layer 26 and the p type base layer 25 with the insulating film 41 (e. g., a gate insulating film) therebetween.

An interlayer insulating film 42 is provided over the gate electrode 51. The emitter electrode 12 is provided on, and electrically contacted with, the emitter layer 26, and it also covers the interlayer insulating film 42.

The emitter electrode 12 is also provided on, and electrically contacted with, the base contact layer 27 as shown in FIG. 4B.

As shown in FIG. 1, in the one power semiconductor chip, the emitter electrode 12 is divided into two parts. The gate wiring 13 surrounds of the emitter electrodes 12 and between the two divided emitter electrodes 12. The gate wiring 13 extends between the divided emitter electrodes 12 in the Y direction.

The emitter electrode 12 and the gate wiring 13 are provided on the upper surface of the interlayer insulating film 42 which is provided on the semiconductor layer 20 and the gate electrode 51 as shown in FIG. 3. A gate pad 15 is provided on the upper surface of the interlayer insulating film 42 as shown in FIG. 1.

As shown in FIG. 1, the gate wiring 13 surrounding the divided emitter electrodes 12, the one line of the gate wiring 13 extending between the divided emitter electrodes, and the gate pad 15 are integrally formed.

A collector electrode 11, the emitter electrode 12, and the gate electrode 13, and gate pad 15 may be composed of metals or other conductors.

The gate wiring 13 is covered with an insulating film 45 as shown in FIG. 3. The upper surface of the emitter electrode 12 and the upper surface of the gate pad 15 are bonded to a wiring or a connector with plate shape (not shown). The collector electrode 11 is bonded to a lead frame (not shown).

As shown in FIG. 4B, the plurality of the emitter layers 26 are located in the cell region 100. The gate wiring is locates in the gate wiring region 200, while the emitter layer 26 is not located there. In the cross sectional view of the semiconductor device of FIG. 4B, the gate wiring region 200 is located toward the middle of the device in the X—direction compared to the location of the emitter layers 26 which are located in the two cell regions 100 to either side of the gate wiring region 200.

As shown in FIG. 4A and FIG. 4B, the p type semiconductor layer 28 is provided on the second main surface side of the $n^-$ type base layer 24 in the gate wiring region 200. The p type base layer 25 extends from the cell region 100 to the surface of the p type semiconductor layer 28 in the gate wiring layer 200. The bottom portion of the p type semiconductor layer 28 is located deeper than the bottom portion of the gate electrode 51 and the bottom portion of the p type base layer 25. The p type semiconductor layer 28 is connected to the emitter electrode 12 through the p type base layer 25 and the $p^+$ type base contact layer 27 formed on the surface of the p type base layer 25.

In the embodiment illustrated in FIG. 4A and FIG. 4B, the p-type base layers 25 is divided by the p-type semiconductor layer 28. In other embodiments, the p-type base layers 25 are not divided and may be integrally arranged above the p-type semiconductor layer 28.

As shown in FIG. 4A, the gate electrode 51 is divided in the X direction by a portion of the semiconductor layer 20 in the gate wiring region 200. The p type semiconductor layer 28 contacts the p-type base layers 25 and also extends along a portion of the bottom side of the gate electrode 51 which is divided in the gate wiring region 200 to alleviate the electric field at the bottom corners of the gate electrode 51 with a trench structure in which the electric field is easily concentrated.

A contact portion 52 is provided as the inner end portion of the gate electrode 51 in the gate wiring region 200, and the contact portion 52 and gate electrode 51 use a same material, for example, polycrystalline silicon. The contact portion 52 is spaced from the semiconductor layer 20. The insulating film 41 is provided between the contact portion 52 and an upper surface of the semiconductor layer 20 (e.g., the second main surface), here the p-type base layers 25. The insulating film also extends over the upper side of the p-type base layers 25 and the portion of the p-type semiconductor layer 28 extending between the p-type base layers 25.

A wiring 53 is provided on the contact portion 52. As shown in FIG. 2, the wiring 53 extends in the Y direction and contact each of the contact portions 52 of the plurality of the gate electrodes spaced from each other in the Y direction. The wiring 53 may include the same material as the gate electrode, for example, a polycrystalline silicon.

As shown in FIG. 4A, the insulating film 41 is provided between the wiring 53 and the upper surface of the semiconductor layer 20, specifically the p-type base layer 25 and the portion of the p-type semiconductor layer 28 extending between portions of the p-type base layers 25. The gate wiring 13 is provided on the wiring 53. The plurality of the gate electrodes 51 are connected to the gate wiring 13 through the contact portion 52 and the wiring 53.

As shown in FIG. 3, the contact portion 52 is also provided on a terminal portion of the end terminal region side of the gate electrode 51. The wiring 53 is provided on the contact portion 52 at the boundary between the end terminal region and the cell region 100, in other words around the emitter layer 12. The gate wiring 13 is provided on the wiring 53 and connected to the gate electrode 51 through the contact portion 52 and the wiring 53.

The bottom corner of the terminal portion of the end terminal region side in the gate electrode 51 also extends over the p type semiconductor layer 28.

A $p^{++}$ type second collector layer 22 is provided between the collector electrode 11 and the buffer layer 23 in the gate wiring region 200 as shown in FIGS. 4 A and 4B.

The number of the p type impurities (e.g., dose amounts in atoms/cm$^2$) of the second collector 22 is higher than the number of the p type impurities (e.g., dose amounts) in atoms/cm$^2$ of the first collector layer 21. A peak value (represented in atoms/cm$^3$) of the p type impurity concentration of the second collector layer 22 is higher than a peak value of the p type impurity concentration of the first collector layer 21. SIMS (secondary Ion Mass Spectrometry) or SRA (Spreading Resistance Analysis) and so on can be used to determine the dopant concentration.

The first collector layer 21 and the second collector layer 22 are provided with approximately the same thickness in a common layer provided between the collector electrode 11 and the buffer layer 23. The second collector layer 22 is not provided under the emitter layer 26.

When the IGBT described herein is applied with a voltage between the collector layer 11 and the emitter layer 12. The voltage applied to the collector electrode 11 is higher than a voltage applied to the emitter electrode 12.

When the IGBT operates in the on-state, a voltage equal to, or greater than, a threshold value is applied to the gate electrode 51, to form an inversion layer (e. g., an n type channel) in the region of the P type base layer 25 of the cell region 100 adjacent to the gate electrode 51 as shown in FIG. 5, and a current passes between the collector electrode 11 and the emitter electrode 12 through the first collector layer 21, the buffer layer 23, n type base layer 24, the p type base layer 25, and the emitter layer 26. As a result, holes are supplied from the first collector layer 21 to the n type base layer 24 to form a high density state due to electrons and holes in the n$^-$ base layer 24, thereby achieving a low on resistance for the IGBT.

The buffer layer 23 prevents the depletion layer from reaching the first collector layer 21 and thus prevents punch-through when the gate electrode 51 is in an off-state.

When an IGBT is turned off as a result of the gate voltage being lower than a threshold value, the channel collapses and electron and current flow is initially cut off. When an element for recirculating the current (such as a circulation diode) is not connected to IGBT on the circuit, the IGBT continues to flow a current due to an avalanche current effect in spite of cutting off the electron current for a short while.

The electron current generated at that time flows into the p type collector layer and the electrons and the holes are recombined locally and efficiently to generate concentration of the current, and thereby, the element may lapse into breakdown.

The characteristics for withstanding breakdown, known as the avalanche withstand amount (also known as "dynamic ruggedness"), is needed to be improved as one of the important design considerations of IGBT.

In the test of the avalanche withstand amount, a simulation result shows that current concentration state can be changed corresponding to hole injection efficiency from the p type collector layer. When the hole injection amounts are large, the holes can efficiently recombine with the electron current flowing into the p type collector layer to generate current concentration more easily. Even when the impurity concentration in the entire region of the p type collector layer in the surface direction is set to a constant value, the current concentration is generated in a portion of a high local impurity concentration which is formed by a variation in manufacturing the IGBT, and as a result the device may break down in a cell region (an IGBT region).

Figure 6A:
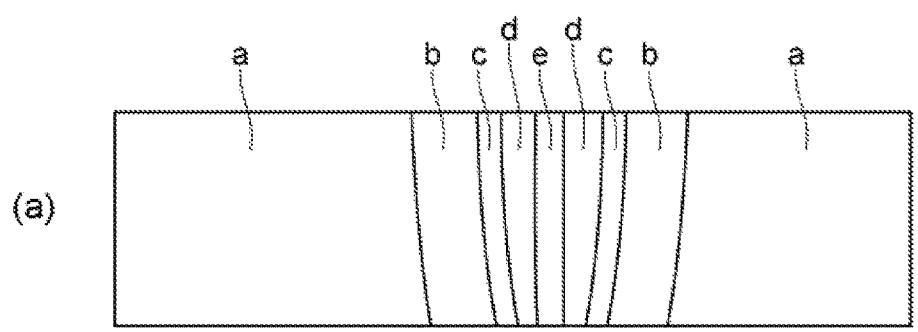
FIG. 6A shows a current density distribution of an IGBT obtained by a simulation.
Figure 6B:
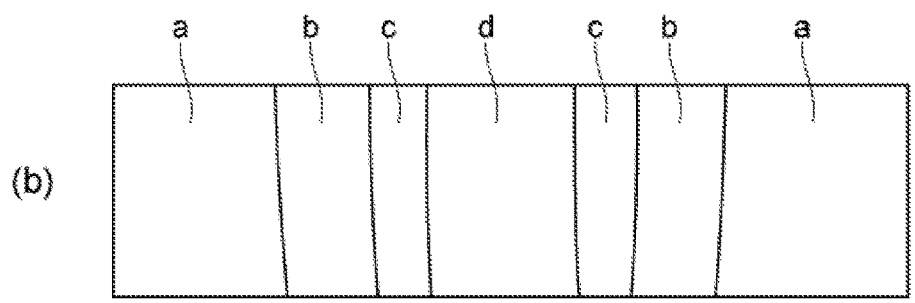
FIG. 6B shows a current density distribution of IGBT obtained by a simulation when the hole injection efficiency from a collector layer is lower than the hole injection efficiency from the collector layer in the simulation of FIG. 6A.

FIG. 6A and FIG. 6B are current density distributions in an IGBT obtained by simulation, and depict a simulation result in a region including a plurality of the gate electrodes 51. FIG. 6A depicts the distribution of a current density when the hole injection efficiency to the p type collector layer in FIG. 6A is higher than the hole injection efficiency to the p type collector layer in FIG. 6B.

A vertical direction and a lateral direction in FIGS. 6A and 6B correspond to a vertical direction (e.g. thickness direction) and a lateral direction in the semiconductor layer respectively.

The simulation result shows that the current density is increased from a region a in which the current density is set to a baseline 1 A/cm$^2$) through a region b and a region c and a region d to a region e, that is, the current density in the region b is larger than the current density in the region a and the current density in the region c is larger than the current density in the region b and the current density in the region d is larger than the current density in the region c and the current density in the region e is larger than the current density in the region d.

When the hole injection efficiency of the p type collector layer providing the simulation result of FIG. 6B is increased, the simulation result of FIG. 6A is achieved. The electrons and the holes in FIG. 6B are more difficult to recombine than the electrons and the holes in FIG. 6A because of the lower hole injection efficiency. Therefore, the electrons and holes which are not recombined in FIG. 6B expand in the lateral direction to decrease a degree of the current concentration.

According to the embodiment, the peak value of the p type impurity concentration in the second collector layer 22 in the gate wiring region (the boundary region) 200 is set to be higher than the peak value of the p type impurity concentration in the first collector layer 21 in the cell region 100 and/or the number of p type impurities per unit area in the second collector layer 22 (e.g. dosage amount) is set to be larger than the number of p type impurities per unit area in the first collector layer 21 (e.g. dosage amount), therefore, the gate wiring region 200 can have a greater hole injection efficiency than the cell region 100.

As a result, when the avalanche current flows, the current concentration occurs in the gate wiring region 200 before the current concentration occurs in the cell region 100. The electrons from the emitter layer 26 in the cell region 100 spread in the lateral direction and expand to the gate wiring region so that the current concentration increases in the gate wiring region 200. The second collector layer 22 with the high hole injection efficiency is spaced from the channel region to not break the element portion of IGBT with components such as the emitter layer 26 and the channel region due to the current concentration in the gate wiring region 200.

The current concentration can occur not in the cell region 100 in which the IGBT element drives but in the gate wiring region 200 to prevent the element portion of IGBT from breaking and to improve the avalanche resistance.

The first collector layer 21 and the second collector layer 22 may be formed by injecting the p type impurities with an ion injection method, for example. In the semiconductor layer 20, a first ion injection may be conducted to an entire layer (an entire region) in which the first collector layer 21 and the second collector layer 22 are formed. Thereafter, a region in which the first collector layer 21 is formed, is masked and a second ion injection may be conducted to a region in which the second collector layer 22 is formed.

The emitter electrode 12 is divided into two in the X direction in FIG. 1, but the emitter electrode may be divided into three or more in the X direction according to a chip size. In the case, the number of the gate wiring 13 provided between the divided emitter electrodes 12 is two or more, that is, the number of the gate wiring regions 200 provided between the cell regions 100 are two or more. Therefore, the two or more second collector layers 22 are arranged in the gate wiring region 200. In FIG. 2, the emitter layers 26 and the base contact layers 27 are arranged alternately in the X direction; alternatively, the emitter layers 26 and the base contact layers 27 are arranged parallel to each other along the gate electrode 51.

These examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified. Furthermore, the components included in the above embodiments can be combined as long as technically feasible. Such combinations are also encompassed within the scope of the embodiments as long as they include the features of the embodiments.

While certain embodiments have been described, these embodiments have been presented by way of example only, and are not intended to limit the scope of the disclosure. Indeed, the methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A semiconductor device comprising:
    a first semiconductor layer having a first main surface and a second main surface;
    a collector electrode provided on the first main surface;
    an emitter electrode provided on the second main surface;
    a gate electrode provided on the second main surface side of the first semiconductor layer and extending in a first direction;
    a gate wiring provided on the second main surface and extending in a second direction intersecting with the first direction and connected to the gate electrode; and
    an insulating film provided between the gate electrode and the first semiconductor layer, wherein the first semiconductor layer comprises:
    a base layer of a first conductivity type;
    a base layer of a second conductivity type between the base layer of the first conductivity type and the emitter electrode;
    an emitter layer of the first conductivity type layer between the base layer of the second conductivity type and the emitter electrode and connected to the emitter electrode;
    a first collector layer of the second conductivity type between the collector electrode in a cell region in which the emitter layer is arranged and the base layer of the first conductivity type; and
    a second collector layer of the second conductivity type between the collector electrode in a boundary region in which the gate wiring is arranged and the base layer of the first conductivity type, a peak value of an impurity concentration of the second conductivity type in the second collector layer being higher than a peak value of an impurity concentration of the second conductivity type in the first collector layer.

2. The semiconductor device according to claim 1, wherein the first semiconductor layer further comprises:
    a second semiconductor layer of the second conductivity type provided in the base layer of the first conductivity type in the boundary region and connected to the emitter electrode.

3. The semiconductor device according to claim 2, wherein
    the gate electrode is divided along the first direction in the first semiconductor layer in the boundary region and the second semiconductor layer of the second conductivity type covers a bottom corner of the divided gate electrode.

4. The semiconductor device according to claim 1, wherein
    the first semiconductor layer further comprises a buffer layer of the first conductivity type between the first collector layer and the base layer of the first conductivity type and between the second collector layer and the base layer of the first conductivity type, and having a first conductive impurity concentration higher than the base layer of the first conductivity type.

5. The semiconductor device according to claim 1, wherein
    the first collector layer has an approximately same thickness as the second collector layer.

6. A semiconductor device comprising:
    a first semiconductor layer having a first main surface and a second main surface;
    a collector electrode provided on the first main surface;
    an emitter electrode provided on the second main surface;

a gate electrode provided in the second main surface side of the first semiconductor layer and extending in a first direction;

a gate wiring provided on the second main surface and extending in a second direction intersecting with the first direction and connected to the gate electrode; and a gate insulating film provided between the gate electrode and the first semiconductor layer, wherein the first semiconductor layer comprises:

a base layer of a first conductivity type;

a base layer of a second conductivity type between the base layer of the first conductivity type and the emitter electrode;

an emitter layer of the first conductivity type between the base layer of the second conductivity type and the emitter electrode and connected to the emitter electrode;

a first collector layer of the second conductivity type between the collector electrode in a cell region in which the emitter layer is arranged and the base layer of the first conductivity type; and a second collector layer of the second conductivity type between the collector electrode in a boundary region in which the gate wiring is arranged and the base layer of the first conductivity type, the number of the second conductivity type impurities per unit area in the second collector layer being higher than the number of the second conductivity type impurities per unit are in the first collector layer.

7. The semiconductor device according to claim 6, wherein
the first semiconductor layer further comprises a second semiconductor layer of the second conductivity type provided in the base layer of the first conductivity type in the boundary region and connected to the emitter electrode.

8. The semiconductor device according to claim 7, wherein
the gate electrode is divided along the first direction in the first semiconductor layer in the boundary region and the second semiconductor layer of the second conductivity type covers a bottom corner of the divided gate electrode.

9. The semiconductor device according to claim 6, wherein
the first semiconductor layer further comprises a buffer layer of the first conductivity type between the first collector layer and the base layer of the first conductivity type and between the second collector layer and the base layer of the first conductivity type and having a first conductive impurity concentration higher than the base layer of the first conductivity type.

10. The semiconductor device according to claim 6, wherein
the first collector layer has an approximately same thickness as the second collector layer.

11. A semiconductor device, comprising:

at least two cell regions comprising a first electrode, a second electrode, and a first layer of a first conductivity type on the first electrode;

a boundary region provided between the cell regions and comprising the first electrode and a second layer of the first conductivity type on the first electrode, a peak value of an impurity concentration of the first conductivity type in the second layer being higher than a peak value of an impurity concentration of the first conductivity type in the first layer; and an end terminal region surrounding the cell regions and the boundary region, wherein the first electrode comprises a collector electrode, the second electrode comprises an emitter electrode, the first layer comprises a first collector layer, the second layer comprises a second collector layer, and the least two cell regions further comprise:

a first base layer of a second conductivity type;

a second base layer of the first conductivity type on the first base layer;

an emitter layer of the second conductivity type on the second base layer; and a gate electrode facing the first base layer, the second base layer, and the emitter layer via an insulating film.

12. The semiconductor device according to claim 11, wherein
the first layer has an approximately same thickness as the second layer.

13. The semiconductor device according to claim 11, wherein
the at least two cell regions include insulated gate bipolar transistors (IGBTs) therein.

14. The semiconductor device according to claim 11, wherein
the boundary region further comprises the first base layer of the second conductivity type and a semiconductor layer of the first conductivity type on the first base layer.

* * * * *